US009219255B2

United States Patent
Jung et al.

(10) Patent No.: US 9,219,255 B2
(45) Date of Patent: Dec. 22, 2015

(54) ORGANIC LAYER DEPOSITION APPARATUS AND METHOD OF MANUFACTURING ORGANIC LIGHT-EMITTING DISPLAY APPARATUS USING THE SAME

(71) Applicant: SAMSUNG DISPLAY CO., LTD., Yongin, Gyeonggi-Do (KR)

(72) Inventors: Jae-Sun Jung, Yongin (KR); Byung-Min Jang, Yongin (KR); Na-Jeong Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 31 days.

(21) Appl. No.: 14/084,275

(22) Filed: Nov. 19, 2013

(65) Prior Publication Data

US 2014/0357001 A1    Dec. 4, 2014

(30) Foreign Application Priority Data

May 31, 2013    (KR) .................. 10-2013-0063080

(51) Int. Cl.
| | | |
|---|---|---|
| *H01L 21/00* | (2006.01) | |
| *H01L 51/56* | (2006.01) | |
| *C23C 14/04* | (2006.01) | |
| *C23C 14/24* | (2006.01) | |
| *C23C 14/56* | (2006.01) | |
| *H01L 21/677* | (2006.01) | |
| *H01L 21/683* | (2006.01) | |
| *H01L 51/00* | (2006.01) | |

(52) U.S. Cl.
CPC .............. *H01L 51/56* (2013.01); *C23C 14/042* (2013.01); *C23C 14/24* (2013.01); *C23C 14/568* (2013.01); *H01L 21/6776* (2013.01); *H01L 21/67709* (2013.01); *H01L 21/6831* (2013.01); *H01L 51/0003* (2013.01)

(58) Field of Classification Search
CPC ............ H01L 51/0002; H01L 21/6776; H01L 51/0003; H01L 51/0008; H01L 51/0011; H01L 51/0014; H01L 51/0025; H01L 51/0032; H01L 2251/566; H01L 2924/12044
See application file for complete search history.

(56) References Cited

U.S. PATENT DOCUMENTS

2008/0018236 A1 * 1/2008 Arai et al. ............... 313/504
2010/0267227 A1 * 10/2010 Ko et al. ................. 438/597

FOREIGN PATENT DOCUMENTS

| KR | 10-2006-0055942 | 5/2006 |
| KR | 10-2006-0057842 | 5/2006 |
| KR | 10-2012-0022135 | 3/2012 |

* cited by examiner

*Primary Examiner* — Thanh Y Tran
(74) *Attorney, Agent, or Firm* — F. Chau & Associates, LLC

(57) ABSTRACT

An organic layer deposition apparatus includes a conveyer unit and a deposition unit that has one or more organic layer deposition assemblies configured to deposit an organic layer on a moving substrate. The conveyer unit includes a moving unit configured to move a substrate fixed thereto, a first conveyer unit configured to move the moving unit in a first direction during which an organic material is deposited on the substrate fixed to the moving unit, and a second conveyer unit configured to move the moving unit in a second direction opposite to the first direction after deposition is completed and the substrate is separated from the moving unit. The first conveyer unit and the second conveyer unit are configured to move through the deposition unit.

5 Claims, 8 Drawing Sheets

ORGANIC LAYER DEPOSITION APPARATUS AND METHOD OF MANUFACTURING ORGANIC LIGHT-EMITTING DISPLAY APPARATUS USING THE SAME

CROSS REFERENCE TO RELATED APPLICATION

This application claims priority under 35 U.S.C. §119 from Korean Patent Application No. 10-2013-0063080, filed on May 31, 2013, in the Korean Intellectual Property Office, and all the benefits accruing therefrom, the contents of which are herein incorporated by reference in their entirety.

BACKGROUND

1. Technical Field

Embodiments of the present disclosure are directed to an organic layer deposition apparatus and a method of manufacturing an organic light-emitting display apparatus using the same.

2. Discussion of the Related Art

Organic light-emitting display devices have attracted attention as a next-generation display apparatus because of their wide viewing angle, high contrast, and fast response time.

An organic light-emitting display apparatus includes an intermediate layer that includes an emission layer disposed between a first electrode and a second electrode which face each other. In this case, the first and second electrodes and the intermediate layer may be formed using various methods. One method is an independent deposition method. A deposition method uses a fine metal mask (FMM) having the same pattern as a pattern to be formed in an organic layer. To manufacture an organic light-emitting display apparatus using a deposition method, the FMM is closely attached to a surface of a substrate on which the organic layer is to be formed, an organic layer material may be deposited, and the patterned organic layer may be formed.

However, using an FMM may increase an area of the organic light-emitting display apparatus by using a large mother glass. This is because when a large mask is used, the large mask may bend due to its weight and thus the pattern may be distorted, which can deteriorate a fine pitch pattern.

Furthermore, it is time-consuming to align and closely attach the substrate and the FMM, perform deposition, and separate the substrate from the FMM, which can lengthen the manufacturing time and lower production efficiency.

SUMMARY

Embodiments of the disclosure can provide an organic layer deposition apparatus and a method of manufacturing an organic light-emitting display apparatus using the same, which may ensure an easier manufacturing process, more easily mass produce large substrates, and form finer pitch pattern.

According to an aspect of the present disclosure, there is provided an organic layer deposition apparatus, the apparatus including: a deposition unit that includes one or more organic layer deposition assemblies configured to deposit an organic layer on a moving substrate, wherein each of the one or more organic layer deposition assemblies includes: a deposition source configured to discharge a deposition material; and a patterning slit sheet disposed to face the deposition source, wherein the patterning slit sheet includes: a first fixing frame; a second fixing frame attached to the first fixing frame, the second fixing frame having at least one portion whose thickness is less than thicknesses of other portions; and a pattern sheet that is fixed to the second fixing frame to face the deposition source and which has a plurality of pattern slits.

The second fixing frame may include: a first fixing portion to which the pattern sheet is fixed; a second fixing portion to which the first fixing frame is fixed; and at least one etching portion formed on at least one of the first fixing portion and the second fixing portion and has at least one portion whose thickness is different from a thickness of the at least one of the first fixing portion and the second fixing portion.

At least one etching indentation may be formed in a surface of the at least one etching portion.

The at least one etching portion may surround an edge of the pattern sheet.

The deposition material discharged by the deposition source may flow through the patterning slit sheet to form a pattern on the moving substrate.

A length of the patterning slit sheet may be less than a length of the moving substrate along a moving direction of the moving substrate.

The organic layer deposition apparatus may include a conveyer unit that includes a moving unit configured to move a substrate fixed thereto, a first conveyer unit configured to move the moving unit in a first direction during which an organic material is deposited on the substrate fixed to the moving unit, and a second conveyer unit configured to move the moving unit in a second direction opposite to the first direction after deposition is completed and the substrate is separated from the moving unit. The first conveyer unit and the second conveyer unit may be configured to move through the deposition unit.

The first conveyer unit and the second conveyer unit may be vertically spaced apart from each other.

The moving unit may be configured to be transferred between the first conveyer unit and the second conveyer unit, and the substrate fixed to the moving unit may be spaced apart from the organic layer deposition assembly by a predetermined interval while being moved by the first conveyer unit.

According to another aspect of the present disclosure, there is provided a method of manufacturing an organic light-emitting display apparatus using an organic layer deposition apparatus, the method including: fixing a substrate to a moving unit; transferring a moving unit to which the substrate is fixed into a chamber by using a first conveyer unit that is configured to enter the chamber, wherein the substrate is spaced apart from an organic layer deposition assembly disposed in the chamber by a predetermined interval, depositing a deposition material discharged from the organic layer deposition assembly on the substrate while the substrate moves relative to the organic layer deposition assembly, to form an organic layer; separating the substrate from the moving unit; and returning the moving unit using a second conveyer unit that is configured to enter the chamber. The organic layer deposition assembly includes: at least one deposition source configured to discharge the deposition material; and a patterning slit sheet that is disposed to face each of the plurality of deposition sources. The deposition material discharged from the organic layer deposition assembly flows through the patterning slit sheet to form a pattern on the moving substrate.

The patterning slit sheet may further include a first fixing frame, a second fixing frame attached to the first fixing frame, the second fixing frame having at least one portion whose thickness is less than thicknesses of other portions, and a pattern sheet fixed to the second fixing frame to face organic layer deposition assembly, and which has a plurality of patterning slits.

The second fixing frame may include: a first fixing portion to which the pattern sheet is fixed; a second fixing portion to which the first fixing frame is fixed; and at least one etching portion formed on at least one of the first fixing portion and the second fixing portion, and has at least one portion whose thickness is different from a thickness of the at least one of the first fixing portion and the second fixing portion.

At least one etching indentation may be formed in a surface of the at least one etching portion.

The at least one etching portion may surround an edge of the pattern sheet.

The moving unit may be configured to be transferred between the first conveyer unit and the second conveyer unit, and the substrate fixed to the moving unit may be spaced apart from the organic layer deposition assembly by a predetermined interval while being moved by the first conveyer unit.

According to another aspect of the present disclosure, there is provided an organic layer deposition apparatus, including a conveyer unit and a deposition unit comprising one or more organic layer deposition assemblies configured to deposit an organic layer on a moving substrate. The conveyer unit includes a moving unit configured to move a substrate fixed thereto, a first conveyer unit configured to move the moving unit in a first direction during which an organic material is deposited on the substrate fixed to the moving unit, and a second conveyer unit configured to move the moving unit in a second direction opposite to the first direction after deposition is completed and the substrate is separated from the moving unit. The first conveyer unit and the second conveyer unit are configured to move through the deposition unit.

Each of the one or more organic layer deposition assemblies may include a deposition source configured to discharge a deposition material, and a patterning slit sheet disposed to face the deposition source. The patterning slit sheet may include a first fixing frame, a second fixing frame attached to the first fixing frame, the second fixing frame having at least one portion whose thickness is less than thicknesses of other portions, and a pattern sheet that is fixed to the second fixing frame to face the deposition source, and which has a plurality of pattern slits. The deposition material discharged by the deposition source may flow through the patterning slit sheet to form a pattern on the moving substrate.

The second fixing frame may include a first fixing portion to which the pattern sheet is fixed, a second fixing portion to which the first fixing frame is fixed, at least one etching portion formed on at least one of the first fixing portion and the second fixing portion that has at least one portion whose thickness is different from a thickness of the at least one of the first fixing portion and the second fixing portion, and at least one etching indentation formed in a surface of the at least one etching portion.

The first conveyer unit and the second conveyer unit may be vertically spaced apart from each other.

The moving unit may be configured to be transferred between the first conveyer unit and the second conveyer unit, and the substrate fixed to the moving unit may be spaced apart from the organic layer deposition assembly by a predetermined interval while being moved by the first conveyer unit.

DETAILED DESCRIPTION OF EXEMPLARY EMBODIMENTS

Hereinafter, embodiments of the present disclosure will be described more fully with reference to the accompanying drawings, in which exemplary embodiments of the disclosure are shown. Embodiments of the disclosure may, however, be embodied in many different forms and should not be construed as being limited to the embodiments set forth herein.

Figure 1:
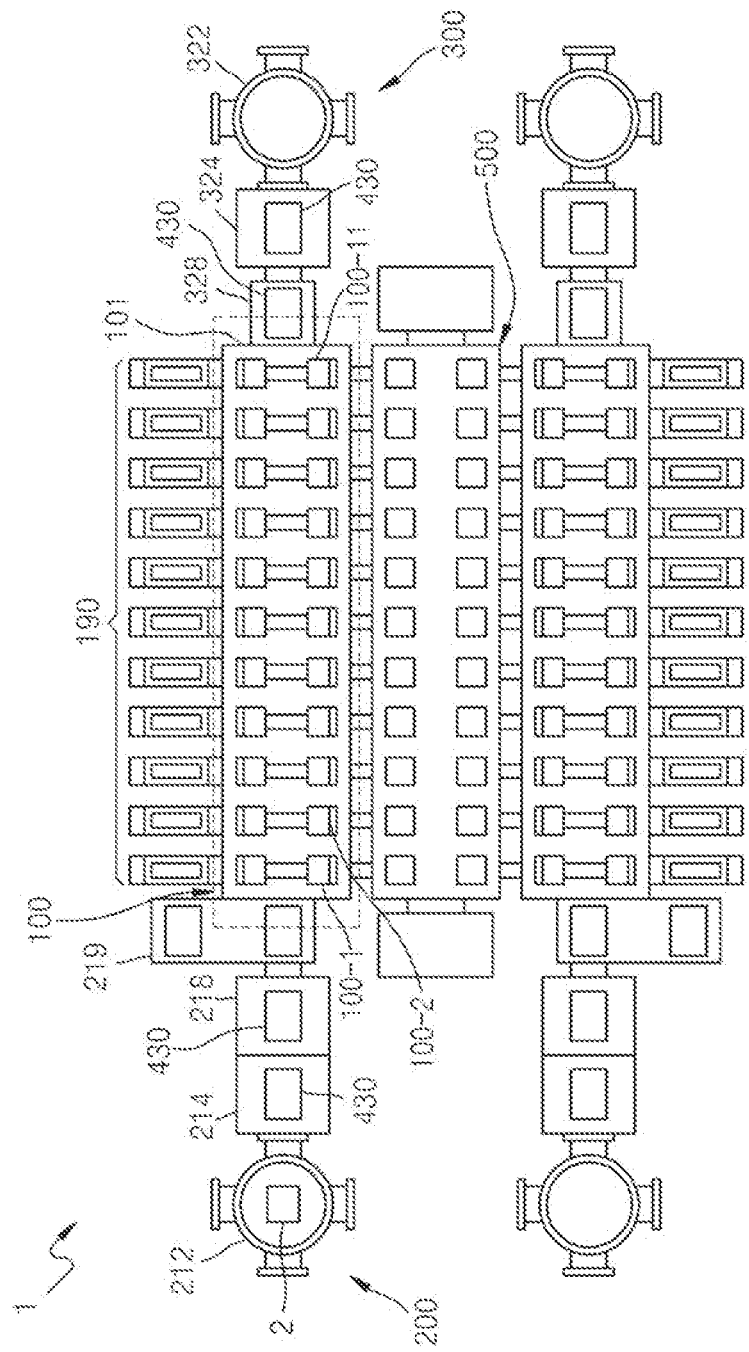
FIG. 1 is a plan view of an organic layer deposition apparatus according to an embodiment of the present disclosure.
Figure 2:
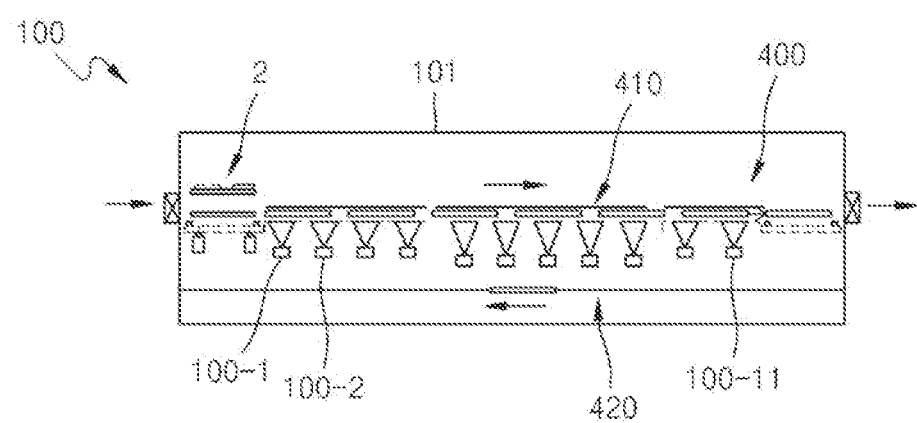
FIG. 2 is a side view of a deposition unit of the organic layer deposition apparatus of FIG. 1.

FIG. 1 is a plan view of an organic layer deposition apparatus 1 according to an embodiment of the present disclosure. FIG. 2 is a side view of a deposition unit 100 of the organic layer deposition apparatus 1 of FIG. 1.

Referring to FIGS. 1 and 2, the organic layer deposition apparatus 1 includes the deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 upon which deposition is to be performed are stacked on the first rack 212. A transport robot provided in the transport chamber 214 picks up one of the substrates 2 from the first rack 212, places the substrate 2 on a moving unit 430 transferred from a second conveyer unit 420, and moves the moving unit 430 with the attached substrate 2 into the first inversion chamber 218.

The first inversion chamber 218 is disposed adjacent to the transport chamber 214, and a first inversion robot located in the first inversion chamber 218 inverts the moving unit 430 and loads the inverted moving unit 430 onto a first conveyer unit 410 of the deposition unit 100.

In FIG. 1, the transport robot of the transport chamber 214 places the substrate 2 on a top surface of the moving unit 430, and in this state, the moving unit 430 is transferred into the inversion chamber 218. As the first inversion robot of the first inversion chamber 218 inverts the first inversion chamber 218, the substrate 2 is turned upside down in the deposition unit 100.

The unloading unit 300 is configured to operate in an opposite manner to the loading unit 200. That is, a second inversion robot in a second inversion chamber 328 inverts the substrate 2 and the moving unit 430 and moves the inverted substrate 2 and moving unit 430 into an ejection chamber 324.

An ejection robot takes the substrate 2 and the moving unit 430 out of the ejection chamber 324, separates the substrate 2 from the moving unit 430, and loads the substrate 2 onto a second rack 322. The moving unit 430 is returned to the loading unit 200 through the second conveyer unit 420.

However, embodiments are not limited thereto. For example, when the substrate 2 is first fixed to the moving unit 430, the substrate 2 may be fixed to a bottom surface of the moving unit 430 and then directly moved into the deposition unit 100. In this case, the first inversion robot of the first inversion chamber 218 and the second inversion robot of the second inversion chamber 328 may be omitted.

The deposition unit 100 includes at least one chamber 101 for deposition. The deposition unit 100 includes a plurality of organic layer deposition assemblies, referred to as the first organic layer deposition assembly 100-1, the second organic layer deposition assembly 100-2, . . . , and the eleventh organic layer deposition assembly 100-11, disposed in the chamber 101. In this case, although 11 organic deposition assemblies are shown in the chamber 101, this number is exemplary and non-limiting, and the number of organic layer deposition assemblies may vary according to a deposition material 115 (see FIG. 3) and a deposition condition. The chamber 101 is maintained in a vacuum while deposition is performed. In this case, since each of the plurality of organic layer deposition assemblies are similar to each other, the following explanation will focus on the first organic layer deposition assembly 100-1.

The moving unit 430 to which the substrate 2 is fixed is sequentially moved by the first conveyer unit 410 to the loading unit 200, the deposition unit 100, and the unloading unit 300, where the moving unit 430 is separated from the substrate 2, and the separated moving unit is returned to the loading unit 200 by the second conveyer unit 420.

The first conveyer unit 410 enters the chamber 101 of the deposition unit 100, and the second conveyer unit 420 is provided to transfer the moving unit 430 separated from the substrate 2.

The first conveyer unit 410 and the second conveyer unit 420 are vertically spaced apart from each other. The moving unit 430 is subjected to deposition while passing through chamber 101 on the first conveyer unit 410, separated from the substrate 2 in the unloading unit 300, and is returned to the loading unit 200 on the second conveyer unit 420 disposed under the first conveyer unit 410, thereby improving space utilization efficiency of the organic layer deposition apparatus 1.

The deposition unit 100 of FIG. 1 may further include a deposition source replacement unit 190 disposed at a side of each organic layer deposition assembly, for example, along side of each of the first organic layer deposition assembly 100-1 to the eleventh organic layer deposition assembly 100-11. Although not shown in detail, the deposition source replacement unit 190 may be a cassette that is externally disposed with respect to the first organic layer deposition assembly 100-1. Accordingly, a deposition source 110 (see FIG. 3) of each of the organic layer deposition assemblies 100-1, . . . , 100-11 may be easily replaced.

The organic layer deposition apparatus 1 shown in FIG. 1 includes two sets of the loading unit 200, the deposition unit 100, the unloading unit 300, and the conveyer unit 400. That is, it would be understood that two organic layer deposition apparatuses 1 are disposed along side of each other in FIG. 1. In this case, a patterning slit sheet replacement unit 500 may be further provided between the two organic layer deposition apparatuses 1. Since the patterning slit sheet replacement unit 500 is provided between the two organic layer deposition apparatuses 1 so that the two organic layer deposition apparatuses 1 may share the patterning slit sheet replacement unit 500, space utilization may be improved with respect to a case when each organic layer deposition apparatus 1 includes its own patterning slit sheet replacement unit 500.

Figure 3:
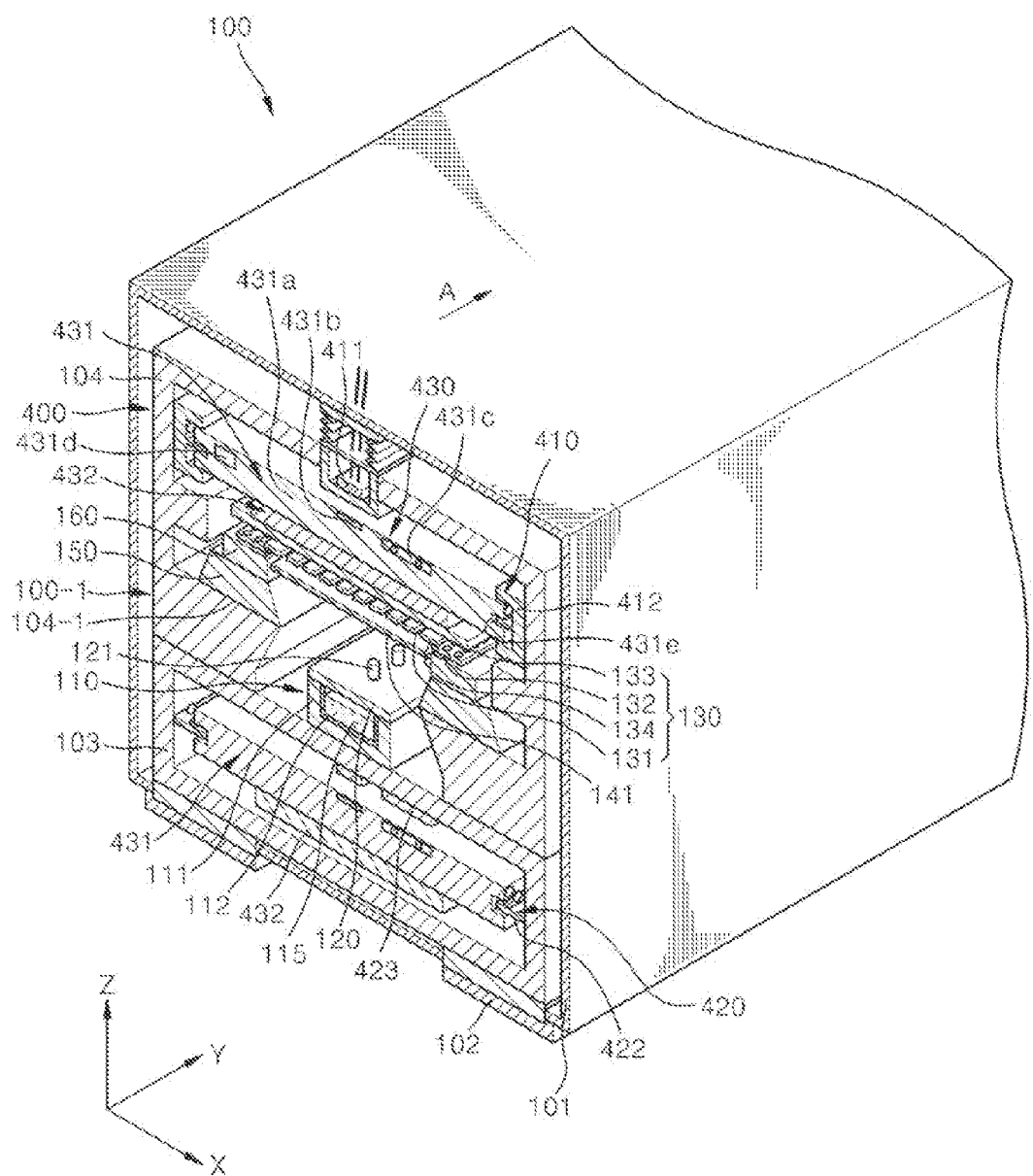
FIG. 3 is a perspective view of the deposition unit of FIG. 1.
Figure 4:
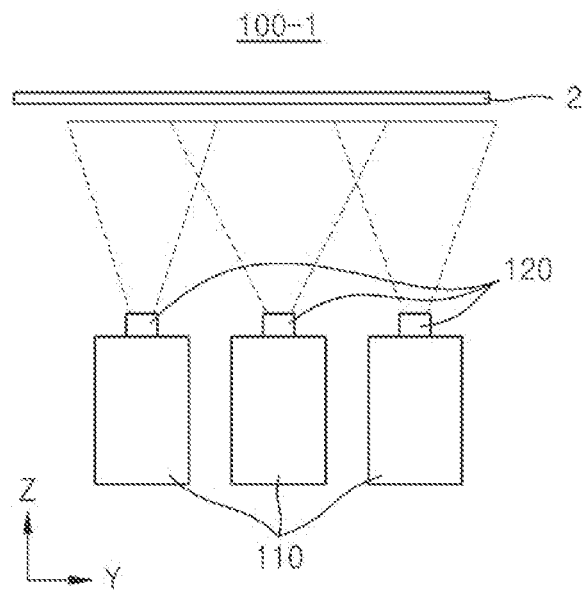
FIG. 4 is a cross-sectional view of an organic layer deposition assembly of FIG. 3.

FIG. 3 is a perspective view of the deposition unit 100 of FIG. 1. FIG. 4 is a cross-sectional view of the deposition unit 100 of FIG. 3.

Referring to FIGS. 3 and 4, the deposition unit 100 of the organic layer deposition apparatus 1 includes at least one organic layer deposition assembly and the conveyer unit 400. Since each of the organic layer deposition assemblies are similar to each other, the following explanation will focus on the first organic layer deposition assembly 100-1.

An overall structure of the deposition unit 100 will now be described.

The chamber 101 has a hollow box shape, and the at least one organic layer deposition assembly and the conveyer unit 400 are received in the chamber 101. The chamber 101 includes a foot 102 to be fixed to the ground, a lower housing 103 disposed on the foot 102, and an upper housing 104 disposed on the lower housing 103. The chamber 101 is configured to receive both the lower housing 103 and the upper housing 104 therein. A connection portion between the lower housing 103 and the chamber 101 is sealed to completely isolate an inside of the chamber 101 from the outside. As such, since the lower housing 103 and the upper housing 104 are disposed on the foot 102, even when the chamber 101 repeatedly contracts and expands, the lower housing 103 and the upper housing 104 may be maintained in fixed positions. Accordingly, the lower housing 103 and the upper housing 104 may function as reference frames in the deposition unit 100.

The first organic layer deposition assembly 100-1 and the first conveyer unit 410 of the conveyer unit 400 are disposed in the upper housing 104, and the second conveyer unit 420 of the conveyer unit 400 is disposed in the lower housing 103. Deposition is continuously performed as the moving unit 430 is transferred by the first conveyer unit 410 to the second conveyer unit 420.

A detailed structure of the first organic layer deposition assembly 100-1 will be described.

The first organic layer deposition assembly 100-1 includes a plurality of deposition sources 110, a deposition source nozzle unit 120, a patterning slit sheet 130, a plurality of source shutters 141, a first stage 150, and a second stage 160. All elements of FIGS. 3 and 4 may be disposed in the chamber 101, which is maintained in an appropriate vacuum state. This structure is used to deposit the deposition material 115 in a straight line.

The substrate 2 upon which deposition is to be performed is disposed in the chamber 101. The substrate 2 may be a substrate for a flat panel display apparatus. A large substrate having a size equal to or greater than 40 inches, such as a mother glass for forming a plurality of flat panel display apparatuses, may be used.

Deposition is performed as the substrate 2 moves relative to the first organic layer deposition assembly 100-1.

In detail, in a conventional fine metal mask (FMM) deposition method, an FMM size should be the same as a substrate size. Accordingly, as the substrate size increases, an FMM size needs to increase, which makes it more challenging to manufacture an FMM, to elongate an FMM, or to align the FMM in a precise pattern.

To address these issues, deposition is performed as the first organic layer deposition assembly 100-1 and the substrate 2 move relative to each other. In other words, deposition is continuously performed as the substrate 2, which faces the first organic layer deposition assembly 100-1, moves in a Y-axis direction, as indicated in FIG. 3. That is, deposition is performed by scanning as the substrate 2 moves in a direction indicated by an arrow A of FIG. 3. Although deposition is performed as the substrate 2 moves in the Y-axis direction in the chamber in FIG. 3, embodiments are not limited thereto. For example, the substrate 2 may be fixed, and deposition may be performed as the first organic layer deposition assembly 100-1 moves in the Y-axis direction.

Accordingly, in the first organic layer deposition assembly 100-1, the patterning slit sheet 130 may be much smaller than a conventional FMM. That is, in the first organic layer deposition assembly 100-1, deposition is continuously performed by scanning as the substrate 2 moves in the Y-axis direction. Accordingly, a length of the patterning slit sheet 130 in at least one of an X-axis direction or the Y-axis direction may be less than a length of the substrate 2. Since the patterning slit sheet 130 may be smaller than a conventional FMM, it may be easier to manufacture the patterning slit sheet 130.

To perform deposition as the first organic layer deposition assembly 100-1 and the substrate 2 move relative to each other, the first organic layer deposition assembly 100-1 may be spaced apart from the substrate by a predetermined interval, which will be described below in detail.

The plurality of deposition sources 110 in which deposition material 115 is received and heated are disposed in the chamber to face the substrate 2. As the deposition material 115 evaporates in each of the plurality of deposition sources 110, the evaporated deposition material is deposited on the substrate 2.

In detail, each of the plurality of deposition sources 110 includes a crucible 111 in which the deposition material 115 is filled, and a heater 112 that heats the crucible 111 to vaporize the deposition material 115 filled in the crucible 111 so that the vaporized deposition material flows toward the deposition nozzle unit 120.

The deposition nozzle unit 120 is disposed at a side of the deposition source 110 facing the substrate 2. The first organic layer deposition assembly 100-1 may have different deposition source nozzles for depositing a common layer and a pattern layer.

The patterning slit sheet 130 is provided between each deposition source 110 and the substrate 2. The patterning slit sheet 130 may include a first fixing frame 132, a second fixing frame 133, and a pattern sheet 134. According to embodiments, the second fixing frame 133 may be provided on the first fixing frame 132, and the pattern sheet 134 may be provided on the second fixing frame 133. According to embodiments, the pattern sheet 134 may be formed to have substantially the same shape as a window frame, and a plurality of patterning slits 131 may be formed in the X-axis direction in the pattern sheet 134.

The deposition material 115 evaporating in each deposition source 110 is discharged through the deposition source nozzle unit 120 and the patterning slit sheet 130 toward the substrate 2 on which deposition is to be performed. According to embodiments, the patterning slit sheet 130 may be manufactured using etching, which is the same method used for manufacturing a conventional FMM, such as a stripe type mask. According to embodiments, the total number of patterning slits 131 may be greater than a total number of deposition source nozzles 121.

The patterning slit sheet 130 may be spaced apart from each deposition source 110 and deposition source nozzle unit 120 coupled thereto by a predetermined interval.

As described above, deposition is performed as the first organic layer deposition assembly 100-1 moves relative to the substrate 2, and for the first organic layer deposition assembly 100-1 to move relative to the substrate 2, the patterning slit sheet 130 is spaced apart from the substrate 2 by a predetermined interval.

In detail, in a conventional FMM deposition method, a deposition process is performed by attaching a mask close to a substrate to prevent a shadow from being formed on the substrate. However, when the mask is attached close to the substrate, defects may occur due to contact between the substrate and the mask. In addition, since the mask does not move relative to the substrate, the mask should be formed to have the same size as that of the substrate. Accordingly, as a display apparatus size increases, a mask size has to increase. However, in a conventional FMM deposition method, it is challenging to form a large mask.

To address these issues, in the first organic layer deposition assembly 100-1, the patterning slit sheet 130 is disposed to be spaced apart from the substrate 2 by a predetermined interval.

According to a present embodiment, since the patterning slit sheet 130 is smaller than the substrate 2 and deposition is performed as the patterning slit sheet 130 moves relative to the substrate 2, the patterning slit sheet 130 may be more easily manufactured. Also, defects due to contact between the substrate 2 and the patterning slit sheet 130 may be avoided. In addition, since there is no need to closely attach the substrate 2 and the patterning slit sheet 130, a manufacturing speed may be increased.

Next, detailed arrangement of elements in the upper housing 104 will be described.

The deposition source 110 and the deposition source nozzle unit 120 are disposed on the bottom of the upper housing 104. Accommodation portions 104-1 protrude from both sides of the upper housing 104, and the first stage 150, the second stage 160, and the patterning slit sheet 130 are sequentially formed on the accommodation portions 104-1.

The first stage 150 is configured to move in the X-axis direction and the Y-axis direction to align the patterning slit sheet 130 in the X-axis and Y-axis directions. That is, the first stage 150 includes a plurality of actuators which may move in the X-axis and Y-axis directions relative to the upper housing 104.

The second stage 160 is configured to move in a Z-axis direction to align the patterning slit sheet 130 in the Z-axis direction. That is, the second stage 160 includes a plurality of actuators which move in the Z-axis direction relative to the first stage 150.

The patterning slit sheet 130 is disposed on the second stage 160. As such, since the patterning slit sheet 130 is disposed on the first stage 150 and the second stage 160, it moves in the X-, Y-, and Z-axis directions so that the substrate 2 and the patterning slit sheet 130 may be aligned with each other.

The upper housing 104, the first stage 150, and the second stage 160 may prevent the deposition material 115 discharged through the deposition source nozzles 121 from being dispersed. That is, a path of the deposited deposition material 115 is determined by the upper housing 104, the first stage 150, and the second stage 160, which thus simultaneously guide the deposition of the deposition material 115 in both the X-axis direction and the Y-axis direction.

The plurality of source shutters 141 may be further provided between the patterning slit sheet 130 and the deposition source 110. The plurality of source shutters 141 may block the deposition material 115 discharged from the deposition source 110.

In addition, a shielding member may be further provided in the deposition unit 100 for preventing organic material from being deposited on a non-film formation area of the substrate 2. The shielding member may be configured to move along with the substrate 2 while covering an edge portion of the substrate 2, and thus covers the non-film formation area of the substrate 2, organic material may be prevented from being deposited on the non-film formation area of the substrate 2.

In addition, a plurality of source shutter driving units may be further provided in the deposition unit 100 for respectively moving the plurality of source shutters 141. According to embodiments, each of the source shutter driving units may include a motor and a gear assembly, or a cylinder. However, embodiments of the source shutter driving unit are not limited thereto, and may include any device that can linearly move the source shutters 141.

The conveyer unit 400 for transferring the substrate 2 on which deposition is to be performed will be described in detail. Referring to FIGS. 3 and 4, the conveyer unit 400 includes the first conveyer unit 410, the second conveyer unit 420, and the moving unit 430.

The first conveyer unit 410 linearly transfers the moving unit 430, which includes a carrier 431 and an electrostatic chuck 432 coupled to the carrier 431, and the substrate 2 attached to the moving unit 430, so that an organic layer is deposited on the substrate 2 due to the first organic layer deposition assembly 100-1.

The moving unit 430 is separated from the substrate 2 in the unloading unit 300 after one deposition is completed in the deposition unit 100, after which the second conveyer unit 420 returns the moving unit 430 to the loading unit 200.

The second conveyer unit 420 includes a roller guide 422, and a charging track 423.

The moving unit 430 that is transferred along the first conveyer unit 410 and the second conveyer unit 420 includes the carrier 431 and the electrostatic chuck 432 coupled to one surface of the carrier 431 and to which the substrate 2 is attached.

Each of elements of the conveyer unit 400 will be described in further detail.

The carrier 431 of the moving unit 430 will now be described in detail.

The carrier 431 includes a main body portion 431a, a linear motion system (LMS) magnet 431b, referred to herein below as a magnetic rail, a contactless power supply (CPS) module 431c, a power supply unit 431d, and guide grooves 431e.

The main body portion 431 is a base portion of the carrier 431, and may be formed of a magnetic material such as iron. The carrier 431 may be spaced apart from a guide unit 412 includes the carrier 431 due to a magnetic force between the main body portion 431a and a magnetically suspended bearing.

The guide grooves 431e may be formed in both side surfaces of the main body portion 431a, and guide protrusions of the guide unit 412 may be received in the guide grooves 431e.

The magnetic rail 431b may be disposed along a central line of the main body portion 431a along a translation direction of the main body portion 431a. The magnetic rail 431b of the main body portion 431a and a coil 411 (explained below) may be coupled to each other to form a linear motor, which may transfer the carrier 431 in a direction indicated by an arrow A.

The CPS module 431c and the power supply unit 431d may be disposed on one side of the magnetic rail 431b of the main body portion 431a. The power supply unit 431d is a battery that supplies power to the electrostatic chuck 431 so that the electrostatic chuck 431 can chuck and maintain the substrate 2, and the CPS module 431c is a wireless charging module for charging the power supply unit 431d. In detail, the charging track 423 formed on the second conveyer unit 420 is connected to an inverter. When the carrier 431 is transferred to the second conveyer unit 420, a magnetic field is formed between the charging track 423 and the CPS module 431c which supplies power to the CPS module 431c. The power supplied to the CPS module 431c is used to charge the power supply unit 431d.

The electrostatic chuck 432 is formed by embedding an electrode into a ceramic main body, and attaches the substrate 2 to a surface of the main body by applying a high voltage to the electrode.

Next, an operation of the moving unit 430 will be described in detail.

The magnetic rail 431b of the main body portion 431a and the coil 411 may be coupled to each other to constitute a driving unit. The driving unit may be a linear motor. A linear motor has a small friction coefficient, little positioning error, and a high degree of position determination as compared to a conventional slide guide system. As described above, a linear motor may include the coil 411 and the magnetic rail 431b, the magnetic rail 431b may be aligned on the carrier 431, and a plurality of the coils 411 may be disposed at predetermined intervals on a side in the chamber 101 to face the magnetic rail 431b. Since the magnetic rail 431b is disposed on the movable carrier 431 instead of the coils 411, the carrier 431 may be driven without supplying power to the carrier 431. The coils 411 may be disposed in an atmosphere (ATM) box in an atmospheric state, and the magnetic rail 431b may be attached to the carrier 431 so that the carrier 431 travels in the chamber 101 that is maintained in vacuum.

The first organic layer deposition assembly 100-1 of the organic layer deposition apparatus 1 may further include a camera for alignment. In detail, the camera may align in real time a mark formed on the substrate 2 with a mark formed on the patterning slit sheet 130. The camera is provided to more accurately view the vacuum chamber 101 during deposition. To this end, the camera may be provided in a camera receiving unit in an atmospheric state.

The first fixing frame 132, the second fixing frame 133, and the pattern sheet 134 will be described in detail.

Figure 5:
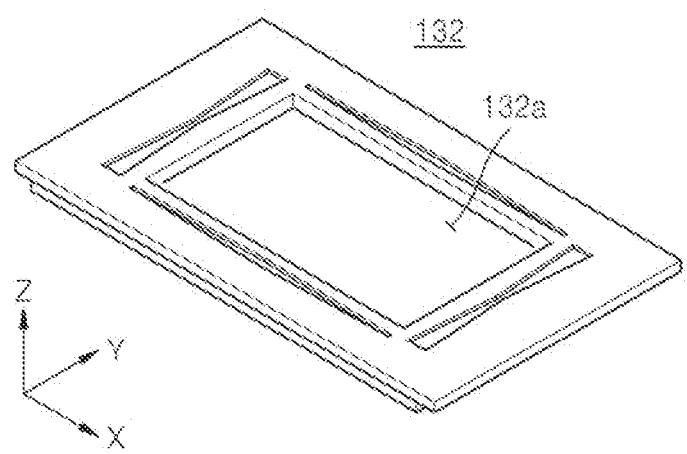
FIG. 5 is a perspective view of a first fixing frame of FIG. 3.
Figure 6:
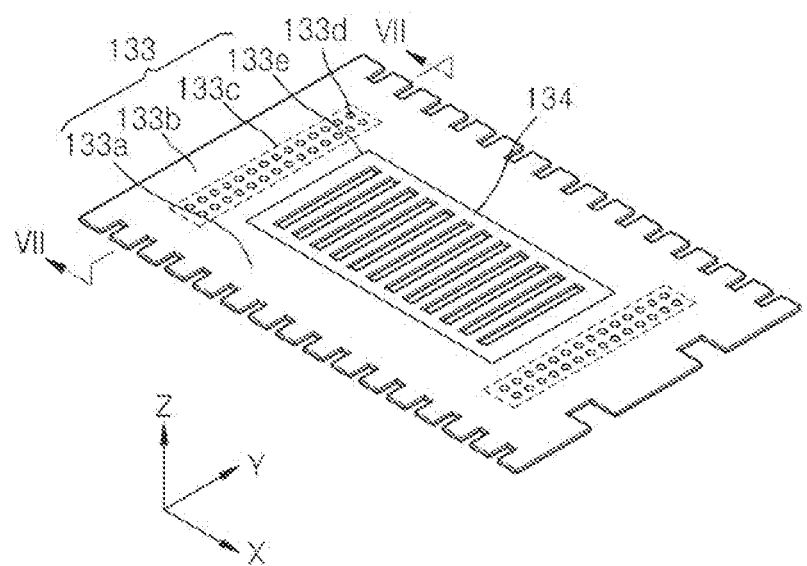
FIG. 6 is a perspective view of a second fixing frame and a pattern sheet of FIG. 3.
Figure 7:
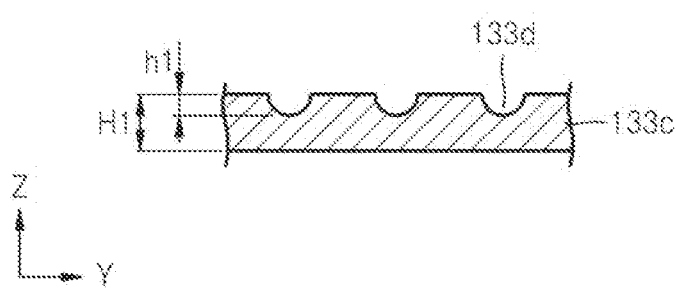
FIG. 7 is a cross-sectional view taken along line VII-VII of FIG. 6.

FIG. 5 is a perspective view of the first fixing frame 132 of FIG. 3. FIG. 6 is a perspective view of the second fixing frame 133 and the pattern sheet 134 of FIG. 3. FIG. 7 is a cross-sectional view taken along line VII-VII of FIG. 6.

Referring to FIGS. 5 through 7, a first hole 132a may be formed in a central portion of the first fixing frame 132. According to embodiments, a deposition material discharged from the deposition source may pass through the first hole 132a. In particular, the deposition material passing through the first hole 132a may pass through the pattern sheet 134 disposed over the first hole 132a and may be supplied to the substrate 2.

A second hole 133e may be formed in a central portion of the second fixing frame 133 to correspond to the first hole 132a. According to embodiments, the pattern sheet 134 may be provided over the second hole 133e.

The second fixing frame 133 may have at least one portion whose thickness is different from that of other portions. According to embodiments, the thickness of the at least one portion of the second fixing frame 133 may be less than that of the other portions.

In detail, the second fixing frame 133 may include a first fixing portion 133a in which the pattern sheet 134 is fixed. In addition, the second fixing frame 133 may include a second fixing portion 133b connected to the first fixing frame 132. In particular, the second fixing frame 133 may include at least one etching portion 133c that is formed in at least one of the first fixing portion 133a and the second fixing portion 133b. According to embodiments, a thickness of at least one portion of the at least one etching portion 133c may be different from that of the first and second fixing portions 133a and 133b.

The etching portion 133c may be formed in various ways. For example, a plurality of etching portions 133c may be formed spaced apart from each other. In addition, the etching portion 133c may be formed on a surface of the second fixing frame 133 to surround the pattern sheet 134. However, for convenience of explanation, embodiments may assume that a plurality of etching portions 133c spaced apart from each other are formed on the second fixing frame 133.

At least one etching indentation 133d may be formed in a surface of the etching portion 133c. According to embodiments, the etching indentation 133d may be recessed from the surface of the etching portion 133c. In particular, the etching indentation 133d may have any of various shapes. For example, the etching indentation 133d may have a hemispherical shape, a square pillar shape, or a triangular pillar shape. Also, the etching indentation 133d may be any of various types of grooves. In this case, the etching indentation 133d is not limited thereto, and may have any shape as long as a depth of the etching indentation 133d is less than a thickness of the second fixing frame 133.

A plurality of the etching indentations 133d may be provided, and may be uniformly distributed in the surface of the etching portion 133c. Alternatively, one etching indentation 133d may be formed over the entire etching portion 133c. A plurality of the etching indentations 133d may be formed over the entire etching portion 133c. For example, a plurality of the etching indentation 133d having hemispherical shapes may be provided. Alternatively, some of the etching indentation 133d may be formed to have hemispherical shapes and others may be formed to have square pillar shapes. However, for convenience of explanation, it is assumed that a plurality of the etching indentation 133d are provided to have hemispherical shapes.

When the plurality of etching indentations 133d are formed, the surface of the etching portion 133c may have an uneven shape. For example, the surface of the etching portion 133c may be formed such that portions in which the etching indentation 133d are formed are recessed and portions in which the etching grooves 133d are not formed are protruded.

In this case, a depth h1 of each of the etching indentations 133d may be less than a thickness H1 of a portion in which the etching indentations 133d are not formed. In detail, the depth h1 of the etching indentations 133d may be 0.5 times the thickness H1 of the portion in which the etching indentations 133d are not formed. For example, suppose the thickness H1 of the etching portion 133c in which the etching indentations 133d are not formed is 0.05 mm, then the depth h1 of the etching indentations 133d may be 0.0025 mm.

The pattern sheet 134 may be provided on the second fixing frame 133. According to embodiments, the pattern sheet 134 may be fixed to the second fixing frame 133 by, for example, welding. In particular, the pattern sheet 134 may be fixed to an outer surface of the second fixing frame 133 to face the first fixing frame 132.

The patterning slit sheet 130 as described above may be manufactured by, for example, welding. In detail, the pattern sheet 134 may be fixed by welding to the second fixing frame 133, and then the second fixing frame 133 and the first fixing frame 132 may be fixed by welding. According to embodiments, the first fixing frame 132 and the pattern sheet 134 on the second fixing frame 133 may be provided to face each other as described above.

When the first fixing frame 132 and the second fixing frame 133 are connected to each other by welding as described above, a counter force may be applied to the first hole 132a of the first fixing frame 132. According to embodiments, a tensile force may be applied to the outside of the second hole 133e of the second fixing frame 133.

When a force is applied to the second fixing frame 133 as described above, the pattern sheet 134 may be prevented from bending due to its weight. In addition, when a force is applied to the first fixing frame 132, the second fixing frame 133 may be prevented from returning to its original position due to its restoring force. In detail, when the first fixing frame 132 and the second fixing frame 133 are fixed as described above, the second fixing frame 133 tends to deform into the second hole 133e due to a second restoring force, and the first fixing frame 132 tends to deform out of the first hole 132a due to a first restoring force. According to embodiments, since the first restoring force and the second restoring force are opposite in direction, the first and second restoring forces offset each other, thereby maximally maintaining a position after the pattern sheet 134 is fixed.

According to embodiments, the etching portion 133c may reduce a tensile force that occurs when the second fixing frame 133 elongates. In particular, since a portion of the etching portion 133c in which the etching indentations 133d are formed has a thickness less than that of other portions, the portion may be elongated with a small tensile force. In addition, the portion of the etching portion 133c in which the etching indentations 133d are not formed may prevent the etching indentations 133d from being torn or damaged due to a tensile force generated in the portion in which the etching indentations 133d are formed. In particular, to reinforce a strength of the etching portion 133c, the portion of the etching portion 133c in which the etching indentations 133d are not formed may have the same thickness as that of the first or second fixing portions 133a and 133b, preventing damage to the etching portion 133c when the second fixing frame 133 elongates.

Since the second fixing frame 133 may be provided on the first fixing frame 132 with a small tensile force, an initial position of the pattern sheet 134 may be maintained in the presence of the first restoring force and the second restoring force after the pattern sheet 134 is provided.

In detail, when the first fixing frame 132 and the second fixing frame 133 are fixed, an initial position of the pattern sheet 134 may be determined due to the first restoring force and the second restoring force. In this case, as time passes and the first restoring force and the second restoring force change with respect to each other, the initial position may change. When a position of the pattern sheet 134 differs from the initial position, a position of the organic layer deposited on the substrate 2 changes, which may reduce pixel position accuracy (PPA), thereby reducing resolution and brightness of the organic light-emitting display apparatus. In particular, the risk that the position of the pattern sheet 134 differs from the initial position may increase as the first restoring force and the second restoring force increase.

However, the organic layer deposition apparatus includes the etching portion 133c to minimize the first and second restoring forces, which minimizes the risk that a position of the pattern sheet 134 may change.

Accordingly, an organic layer deposition apparatus may accurately deposit an organic layer and may improve PPA by using the etching portion 133c.

Figure 8:
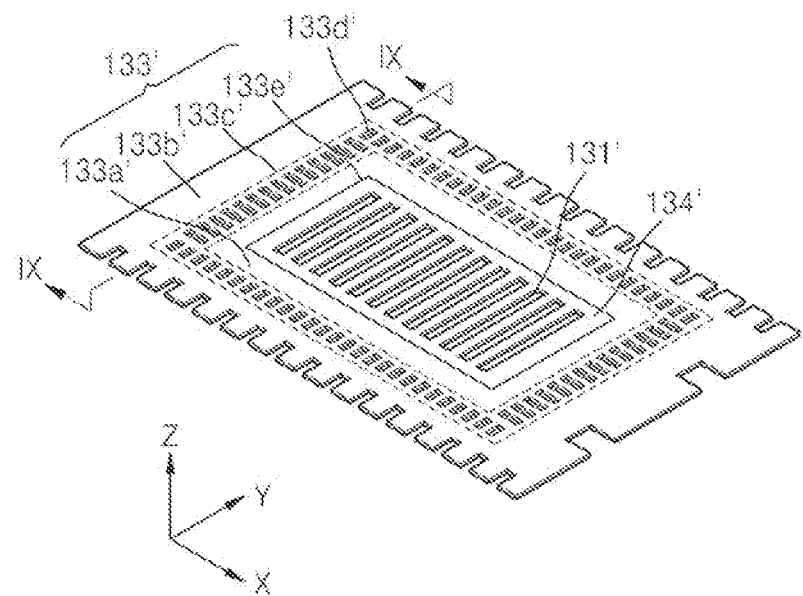
FIG. 8 is a perspective view of a second fixing frame of FIG. 3 according to another embodiment of the present disclosure.
Figure 9:
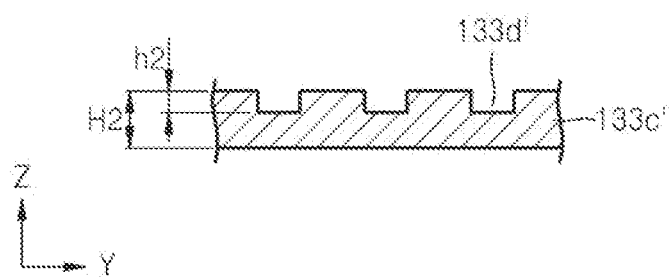
FIG. 9 is a cross-sectional view taken along line IX-IX of FIG. 8.

FIG. 8 is a perspective view of a second fixing frame 133' of FIG. 3, according to another embodiment of the present disclosure. FIG. 9 is a cross-sectional view taken along line IX-IX of FIG. 8.

Referring to FIGS. 8 and 9, the second fixing frame 133' may be formed in a manner similar to that described above. According to embodiments, the second fixing frame 133' may include a first fixing portion 133a', a second fixing portion 133b', an etching portion 133c', and second hole 133e' in a central portion thereof. The etching portion 133c' may include etching indentations 133d'

The etching indentation 133d' may have any of various shapes as described above. In addition, a plurality of the etching indentations 133d' may be provided spaced apart from each other. However, for convenience of explanation, embodiments may assume that the etching indentations 133d' have a square pillar shape and the etching portion 133c' has a connected shape.

The etching indentations 133d' in the etching portion 133c' may have a square shape. In this case, the etching indentations 133d' may be recessed from a surface of the etching portion 133c' as described above, and the etching portion 133c' may have an uneven surface. In particular, the etching indentations 133d' may be formed by etching using a photo mask. In this case, etching using the photo mask is sufficiently similar to a general etching method that a detailed explanation thereof will not be given.

A depth h2 of the etching indentations 133d' may differ from a thickness H2 of the etching portion 133c' in which the etching indentations 133d' are not formed. According to embodiments, the depth h2 of the etching indentations 133d' may be less than the thickness H2 of the etching portion 133c' in which the etching indentations 133d' are not formed.

The second fixing frame 133' as described above may be coupled to the first fixing frame 132' and the pattern sheet 134' in an identical or similar manner to that described above. According to embodiments, the second fixing frame 133' may be coupled to the first fixing frame 132' with a small tensile force. In particular, the etching portion 133c' may reduce a tensile force applied to the second fixing frame 133' as described above.

Accordingly, an organic layer deposition apparatus may accurately deposit an organic layer using the etching portion 133c, and may improve PPA.

Figure 10:
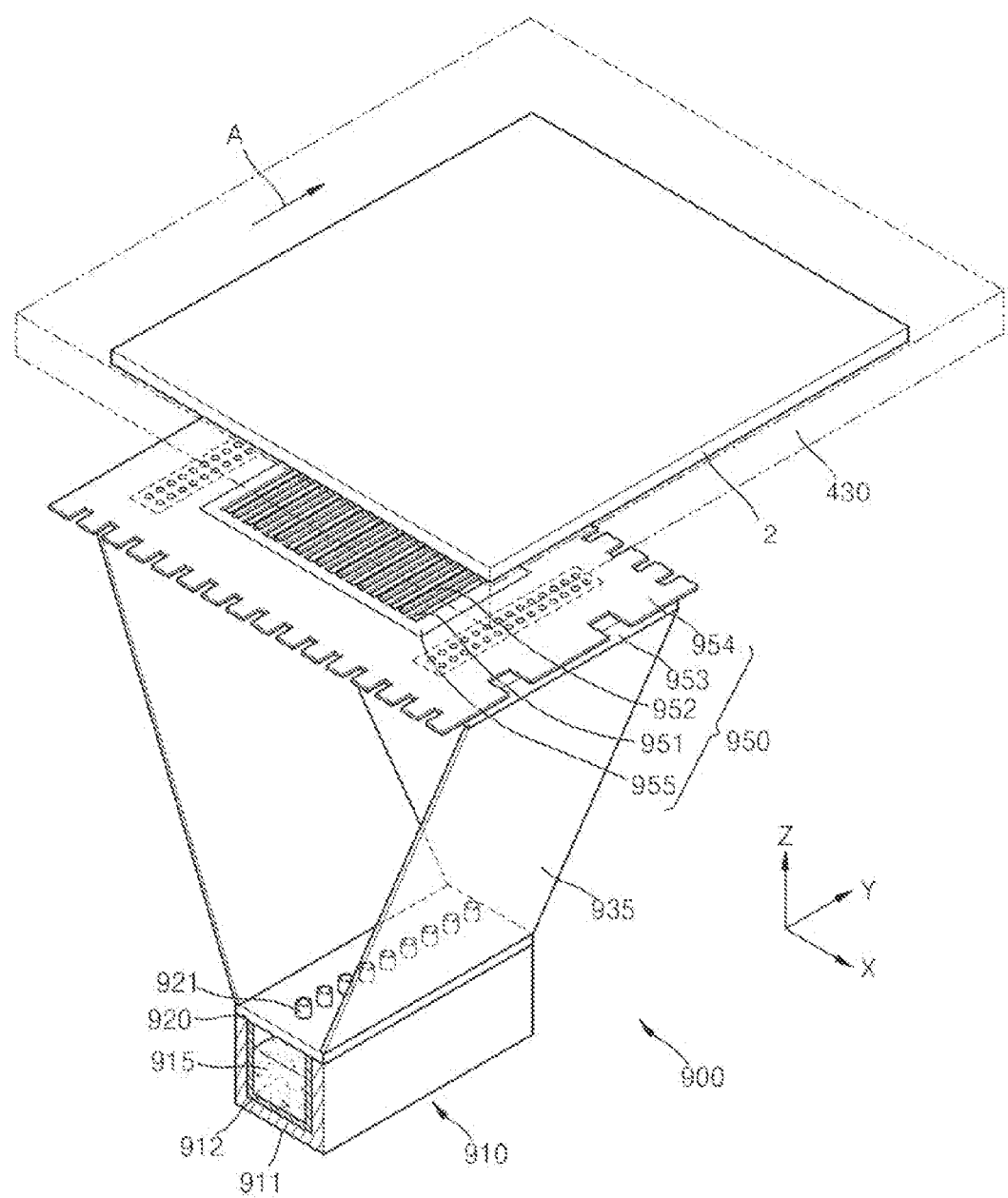
FIG. 10 is a perspective view of an organic layer deposition assembly according to another embodiment of the present disclosure.

FIG. 10 is a perspective view of an organic layer deposition assembly 900 according to another embodiment of the present disclosure.

Referring to FIG. 10, the organic layer deposition assembly 900 includes a deposition source 910, a deposition source nozzle unit 920, and a patterning slit sheet 950. In addition, the organic layer deposition assembly 900 further includes a source shutter.

The deposition source 910 includes a crucible 911 in which a deposition material 915 is filled, and a heater 912 that heats the crucible 911 to vaporize the deposition material 915 to flow toward the deposition source nozzle unit 920. The deposition source nozzle unit 920 is disposed at one side of the deposition source 910, and includes a plurality of deposition source nozzles 921 disposed in a Y-axis.

The patterning slit sheet 950 may be further provided between the deposition source 910 and the substrate 2. The patterning slit sheet 950 may include a first fixing frame 953, a second fixing frame 954, and a pattern sheet 955. According to embodiments, a plurality of patterning slits 951 and spacers 952 are formed in an X-axis direction in the pattern sheet 955. The first deposition source 910, the deposition source nozzle unit 920, and the patterning slit sheet 950 are coupled to one another by connection members 935.

The plurality of deposition source nozzles 921 provided in the deposition source nozzle unit 920 are arranged differently from those in previous embodiments, which will be described in detail.

The deposition source nozzle unit 920 is disposed at one side of the deposition source 910, in detail, at a side of the deposition source 910 facing the substrate 2. The deposition source nozzles 921 are formed in the deposition source nozzle unit 920. The deposition material 915 evaporating in the deposition source 910 are discharged through the deposition source nozzles 921 and flow toward the substrate 2 on which deposition is to be performed. According to embodiments, if the plurality of deposition source nozzles 921 are provided in the X-axis direction, distances from the deposition source nozzles 921 to the pattern slits 951 may differ from each other, and thus shadows may occur due to deposition material being discharged from a deposition source nozzle 921 far from the patterning slit 951. Accordingly, the deposition source nozzles 921 are disposed in a Y-direction such that each deposition source nozzle 921 is a same distance from the same patterning slit 951, which may reduce shadow occurrences.

The source shutter may be provided between the connection members 935.

Figure 11:
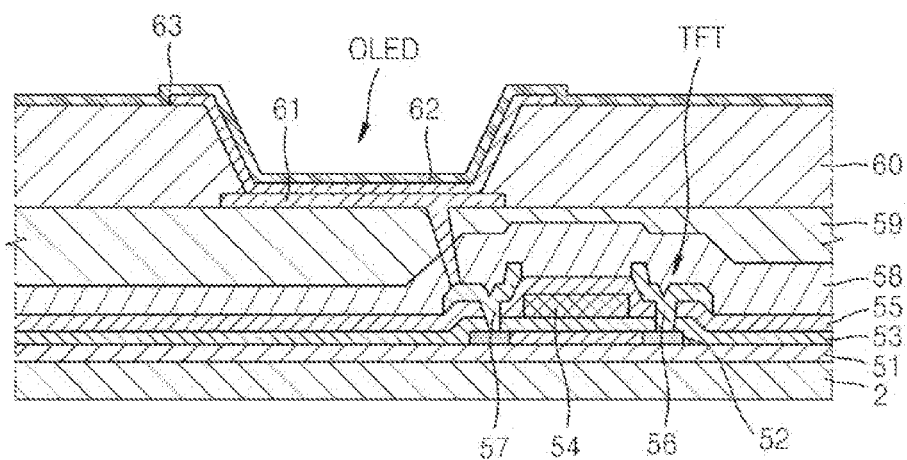
FIG. 11 is a cross-sectional view of an active matrix organic light-emitting display apparatus manufactured using an organic layer deposition apparatus according to an embodiment of the present disclosure.

FIG. 11 is a cross-sectional view of an active matrix organic light-emitting display apparatus manufactured using an organic layer deposition apparatus, according to an embodiment of the present disclosure.

Referring to FIG. 11, an active matrix organic light-emitting display apparatus is formed on the substrate 2. The substrate 2 may be formed of a transparent material, such as glass, plastic, or a metal. An insulating film 51 such as a buffer layer is formed over the entire substrate 2.

A thin film transistor (TFT) and an organic light-emitting device (OLED) are formed on the insulating film 51 as shown in FIG. 11.

A semiconductor active layer 52 arranged in a predetermined pattern is formed on a top surface of the insulating film 51. The semiconductor active layer 52 is covered by a gate insulating film 53. The semiconductor active layer 52 may include a p-type or n-type semiconductor.

A gate electrode 54 of the TFT is formed on a top surface of the gate insulating film 53 to correspond to the semiconductor active layer 52. An interlayer insulating film 55 is formed to cover the gate electrode 54. After the interlayer insulating film 55 is formed, the gate insulating film 53 and the interlayer insulating film 55 are etched using an etching process such as dry etching to form a contact hole through which a portion of the semiconductor active layer 52 is exposed.

Next, source electrode 56 and drain electrode 57 are formed on the interlayer insulating film 55 to contact the portion of the semiconductor active layer 52 exposed through the contact hole. A protective film 58 is formed to cover the source electrode 56 and drain electrode 57, and a portion of the drain electrode 57 is exposed using an etching process. An insulating film 59 may be further formed on the protective film 58 to planarize the protective film 58.

An organic light-emitting device (OLED) displays predetermined image information by emitting red, green, and blue light as current flows. The OLED includes a first electrode 61 formed on the protective film 58 that is electrically connected to the drain electrode 57 of the TFT.

A pixel-defining film 60 is formed to cover the first electrode 61. After an opening is formed in the pixel-defining film 60, an organic layer 62 that includes an emission layer is formed in an area defined by the opening. A second electrode 63 is formed on the organic layer 62.

The pixel-defining film 60 that defines individual pixels is formed of an organic material, and planarizes a surface of a substrate on which the first electrode 61 is formed, in particular, a surface of the insulating film 59.

The first electrode 61 and the second electrode 63 are insulated from each other, and apply voltages of opposite polarities to the organic layer 62 that includes the emission layer to emit light.

The organic layer may use a low molecular weight organic material or a high molecular weight organic material. If the organic layer includes a low molecular weight organic material, the organic layer may have a single or multi-layer structure that includes a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 62 may be deposited by the organic layer deposition apparatus 1 that includes a deposition source that discharges a deposition material, a deposition source nozzle unit disposed at a side of the deposition source and having a plurality of deposition source nozzles formed therein, and a patterning slit sheet disposed to face the deposition source nozzle unit and having a plurality of patterning slits formed therein, as shown in FIG. 1. After the organic layer deposition apparatus is disposed to be spaced apart from a substrate on which deposition is to be performed, the deposition material discharged by the organic layer deposition apparatus 1 is deposited on the substrate 2 as the organic layer deposition apparatus 1 and the substrate 2 move relative to each other.

After the organic light-emitting film is formed, the second electrode 63 is formed using the same deposition process.

The first electrode 61 may function as an anode whereas the second electrode 63 may function as a cathode, or vice versa. The first electrode 61 may be patterned to correspond to each pixel area, and the second electrode 63 may be formed to cover all pixels.

The first electrode 61 may be a transparent electrode or a reflective electrode. If the first electrode 61 is a transparent electrode, the first electrode 61 may include indium tin oxide (ITO), indium zinc oxide (IZO), zinc oxide (ZnO), or indium oxide ($In_2O_3$). If the first electrode 61 is a reflective electrode, the first electrode 61 may be formed by forming a reflective layer using silver (Ag), magnesium (Mg), aluminum (Al), platinum (Pt), palladium (Pd), gold (Au), nickel (Ni), neodymium (Nd), iridium (Ir), chromium (Cr), or a compound thereof, and then forming a transparent electrode layer on the reflective layer using ITO, IZO, ZnO, or $In_2O_3$. The first electrode 61 may be formed using sputtering and then may be patterned using photolithography.

The second electrode 63 may also be a transparent electrode or a reflective electrode. If the second electrode 63 is a transparent electrode, since the second electrode 63 is used as a cathode, the transparent electrode may be formed by depositing a metal having a low work function, such as, lithium (Li), calcium (Ca), lithium fluoride/calcium (LiF/Ca), aluminum (Al), silver (Ag), magnesium (Mg), or a compound thereof to face the organic layer 62, and then forming an auxiliary electrode layer or a bus electrode line thereon by using ITO, IZO, ZnO, or $In_2O_3$. If the second electrode 63 is a reflective electrode, the second electrode 63 is formed by depositing Li, Ca, LiF/Ca, LiF/Al, Al, Ag, Mg, or a compound thereof. According to embodiments, the deposition may be performed in the same manner as that used to form the organic layer 62.

Embodiments of the present disclosure may also be used to deposit an organic layer or an inorganic film of an organic TFT, and to form films using various other materials.

According to the embodiments of the present disclosure, since a thickness of at least one portion of a second fixing frame is different from thicknesses of other portions of the second fixing frame to reduce a tensile force applied thereto, deformation or deviation of a pattern sheet may be minimized.

While embodiments of the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A method of manufacturing an organic light-emitting display apparatus using an organic layer deposition apparatus, the method comprising:
   fixing a substrate to a moving unit;
   transferring the moving unit to which the substrate is fixed into a chamber by using a first conveyer unit that is configured to enter the chamber, wherein the substrate is spaced apart from an organic layer deposition assembly disposed in the chamber by a predetermined interval;
   depositing a deposition material discharged from the organic layer deposition assembly on the substrate while the substrate moves relative to the organic layer deposition assembly, to form an organic layer;
   separating the substrate from the moving unit; and
   returning the moving unit using a second conveyer unit that is configured to enter the chamber,
   wherein the organic layer deposition assembly comprises:
      at least one deposition source configured to discharge the deposition material; and
      a patterning slit sheet that is disposed to face each of a plurality of deposition sources,
   wherein the deposition material discharged from the organic layer deposition assembly flows through the patterning slit sheet to form a pattern on the moving substrate,
   wherein the patterning slit sheet comprises:
   a first fixing frame;
   a second fixing frame attached to the first fixing frame the second fixing frame having at least one portion whose thickness is less than thicknesses of other portions; and
   a pattern sheet that is fixed to the second fixing frame to face the organic layer deposition assembly, and which has a plurality of patterning slits.

2. The method of claim 1, wherein the second fixing frame comprises:
   a first fixing portion to which the pattern sheet is fixed;
   a second fixing portion to which the first fixing frame is fixed; and
   at least one etching portion formed on at least one of the first fixing portion and the second fixing portion and has at least one portion whose thickness is different from a thickness of the at least one of the first fixing portion and the second fixing portion.

3. The method of claim 2, wherein at least one etching indentation is formed in a surface of the at least one etching portion.

4. The method of claim 2, wherein the at least one etching portion surrounds an edge of the pattern sheet.

5. The method of claim 1, wherein the moving unit is configured to be transferred between the first conveyer unit and the second conveyer unit, and the substrate fixed to the moving unit is spaced apart from the organic layer deposition assembly by a predetermined interval while being moved by the first conveyer unit.

* * * * *